United States Patent
Ham et al.

(10) Patent No.: US 11,293,985 B2
(45) Date of Patent: Apr. 5, 2022

(54) SWITCH DIAGNOSING APPARATUS AND METHOD

(71) Applicant: LG Chem, Ltd., Seoul (KR)

(72) Inventors: Sang-Hyeok Ham, Daejeon (KR); Hong-Seok Ju, Daejeon (KR)

(73) Assignee: LG Energy Solution, Ltd.

(*) Notice: Subject to any disclaimer, the term of this patent is extended or adjusted under 35 U.S.C. 154(b) by 0 days.

(21) Appl. No.: 16/962,535

(22) PCT Filed: Sep. 11, 2019

(86) PCT No.: PCT/KR2019/011828
§ 371 (c)(1),
(2) Date: Jul. 16, 2020

(87) PCT Pub. No.: WO2020/055162
PCT Pub. Date: Mar. 19, 2020

(65) Prior Publication Data
US 2020/0355746 A1    Nov. 12, 2020

(30) Foreign Application Priority Data

Sep. 12, 2018 (KR) .................. 10-2018-0109206

(51) Int. Cl.
*G01R 31/327* (2006.01)
*G01R 19/10* (2006.01)
(Continued)

(52) U.S. Cl.
CPC ......... *G01R 31/3277* (2013.01); *G01R 19/10* (2013.01); *G01R 19/16576* (2013.01);
(Continued)

(58) Field of Classification Search
CPC ............... G01R 31/3277; G01R 19/10; G01R 19/16576; G01R 31/007; G01R 19/165;
(Continued)

(56) References Cited

U.S. PATENT DOCUMENTS 6,198,255 B1    3/2001 Yoshida
2010/0296204 A1   11/2010 Ichikawa et al.
(Continued)

FOREIGN PATENT DOCUMENTS

JP    2000358335 A    12/2000
JP    2008154439 A    7/2008
(Continued)

OTHER PUBLICATIONS

S. Ci, N. Lin and D. Wu, "Reconfigurable Battery Techniques and Systems: A Survey," in IEEE Access, vol. 4, pp. 1175-1189, 2016 (Year: 2016).*
(Continued)

*Primary Examiner* — Daniel R Miller
(74) *Attorney, Agent, or Firm* — Lerner, David, Littenberg, Krumholz & Mentlik, LLP

(57) ABSTRACT

A switch diagnosing apparatus and method capable of effectively diagnosing a switch of a battery pack. If a plurality of battery modules having a parallel structure are provided, the switch connected to a diagnosis target battery module may be effectively diagnosed based on the voltage of a switch connected to a battery module other than the diagnosis target battery module.

7 Claims, 2 Drawing Sheets

(51) Int. Cl.
 *G01R 19/165* (2006.01)
 *H01M 10/42* (2006.01)
 *H01M 10/48* (2006.01)

(52) U.S. Cl.
 CPC ......... *H01M 10/425* (2013.01); *H01M 10/48* (2013.01); *H01M 2010/4271* (2013.01)

(58) Field of Classification Search
 CPC .. G01R 31/52; G01R 31/3278; G01R 31/327; G01R 31/006; G01R 31/40; G01R 31/50; G01R 31/3275; G01R 31/42; G01R 31/396; G01R 31/54; G01R 31/343; G01R 35/00; G01R 31/2621; H01M 10/425; H01M 10/48; H01M 2010/4271; H01M 50/284; H01M 50/298; H01M 50/244; H01M 10/482; H01M 50/20; Y02E 60/10
 See application file for complete search history.

(56) References Cited

U.S. PATENT DOCUMENTS

| | | | |
|---|---|---|---|
| 2013/0229186 A1 | 9/2013 | Shiraishi et al. | |
| 2016/0336736 A1* | 11/2016 | Nomura | G01R 31/396 |
| 2018/0278066 A1* | 9/2018 | Kurahashi | B60L 58/21 |
| 2019/0047436 A1 | 2/2019 | Song | |
| 2019/0267679 A1* | 8/2019 | Lee | H01M 50/50 |
| 2020/0083732 A1 | 3/2020 | Kim et al. | |
| 2020/0142002 A1* | 5/2020 | Park | G01R 31/3278 |
| 2021/0005938 A1* | 1/2021 | Hayashi | G01R 31/371 |

FOREIGN PATENT DOCUMENTS

| | | | |
|---|---|---|---|
| JP | 2010254038 A | | 11/2010 |
| JP | 5418219 B2 | | 2/2014 |
| JP | 2016171637 A | | 9/2016 |
| JP | 2016219229 A | | 12/2016 |
| JP | 2017005939 A | * | 1/2017 |
| JP | 2017065340 A | | 4/2017 |
| JP | 2017112759 A | | 6/2017 |
| JP | 2018026889 A | | 2/2018 |
| KR | 101440531 B1 | | 9/2014 |
| KR | 101504274 B1 | | 3/2015 |
| KR | 20150025428 A | | 3/2015 |
| KR | 20170097481 A | | 8/2017 |
| KR | 20180026948 A | | 3/2018 |
| KR | 20180039454 A | | 4/2018 |
| KR | 20180043030 A | | 4/2018 |

OTHER PUBLICATIONS

International Search Report for PCT/KR2019/011828 dated Dec. 27, 2019; 2 pages.
Extended European Search Report including Written Opinion for Application No. 19860584.2 dated Apr. 13, 2021, 11 pages.

* cited by examiner

SWITCH DIAGNOSING APPARATUS AND METHOD

CROSS-REFERENCE TO RELATED APPLICATIONS

The present application is a national phase entry under 35 U.S.C. § 371 of International Application No. PCT/KR2019/011828 filed Sep. 11, 2019, published in Korean, which claims priority from Korean Patent Application 10-2018-0109206 filed Sep. 12, 2018, all of which are incorporated herein by reference.

TECHNICAL FIELD

The present disclosure relates to a switch diagnosing apparatus and method, and more particularly, to a switch diagnosing apparatus and method capable of effectively diagnosing a switch during a process of diagnosing the switch provided to a battery pack.

BACKGROUND ART

In recent years, the demand for portable electronic products such as notebook computers, video cameras and portable phones has increased sharply, and the electric vehicles, energy storage batteries, robots and satellites has been active developed. Accordingly, high-performance secondary batteries allowing repeated charging and discharging are being actively studied.

Secondary batteries currently commercialized include nickel cadmium batteries, nickel hydride batteries, nickel zinc batteries, and lithium secondary batteries. Among them, the lithium secondary batteries have almost no memory effect compared to nickel-based secondary batteries, to freely charge and discharge, and have a very low self-discharge rate and a high energy density. Thus, lithium secondary batteries have attracted much attention.

Batteries are used in various fields. In recent years, in the fields such as electric-driven vehicles or smart grid systems in which batteries are frequently utilized, large capacity is often required. In order to increase the capacity of a battery pack, it is possible to increase the capacity of each secondary battery, namely a battery cell itself. However, in this case, the capacity is not increased greatly, and increasing the size of the secondary battery has a physical limitation and causes inconvenience of management. Thus, a battery pack in which a plurality of battery modules are connected in series and in parallel is widely used.

The battery is connected to a load, a charger or the like to supply power to the load so that the load operates, or is charged with power supplied from the charger. That is, the battery is generally used in electrical connection with a system such as a load or a charger. At this time, the battery and the system are connected through a line for power supply, and a contactor or a MOSFET (MOS Field-Effect Transistor) is provided to the line between the battery and the system to perform a switching operation. However, in the related art, it is only possible to control whether or not to supply a current by using the MOSFET, and a function for diagnosing a failure of the MOSFET is not provided. In this case, since a failure of the MOSFET is not diagnosed, the energy loss increases according to the amount of heat generated from the MOSFET.

SUMMARY

Technical Problem

The present disclosure is designed to solve the problems of the related art, and therefore the present disclosure is directed to providing an improved switch diagnosing apparatus and method, which may effectively diagnose a switch during a process of diagnosing the switch provided to a battery pack.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a switch diagnosing apparatus, which diagnoses switches of a plurality of battery modules respectively having at least one secondary battery and connected to each other in parallel, the switch diagnosing apparatus comprising: a plurality of positive electrode module switches, each positive electrode module switch included in a respective positive electrode charging and discharging path directly connected to a positive electrode terminal of a corresponding one of the plurality of battery modules to open or close the positive electrode charging and discharging path; a plurality of negative electrode module switches, each negative electrode module switch included in a respective negative electrode charging and discharging path directly connected to a negative electrode terminal of the plurality of battery modules to open or close the negative electrode charging and discharging path; a positive electrode diagnosis terminal included in an integrated positive electrode path between the plurality of positive electrode module switches and a positive electrode terminal of a battery pack; a negative electrode diagnosis terminal included in an integrated negative electrode path between the plurality of negative electrode module switches and a negative electrode terminal of the battery pack; a voltage measuring unit configured to measure voltages of the positive electrode diagnosis terminal and the negative electrode diagnosis terminal; and a processor configured to receive the voltages of the positive electrode diagnosis terminal and the negative electrode diagnosis terminal from the voltage measuring unit and diagnose whether the positive electrode module switch and the negative electrode module switch of at least one battery module among the plurality of battery modules are in a stalled state based on the voltages of the positive electrode diagnosis terminal and the negative electrode diagnosis terminal.

In addition, the processor may be configured to determine that the positive electrode module switch and the negative electrode module switch of at least one battery module among the plurality of battery modules is in the stalled state when a voltage difference between the positive electrode diagnosis terminal and the negative electrode diagnosis terminal is equal to or greater than a predetermined threshold value.

In addition, the processor may be configured to determine that the positive electrode module switches and the negative electrode module switches of the plurality of battery modules are in a normal state when a voltage difference of the positive electrode diagnosis terminal and the negative electrode diagnosis terminal is equal to or smaller than a predetermined threshold value.

In addition, there is provided a switch diagnosing apparatus according to another embodiment of the present disclosure, which diagnoses switches of a plurality of battery modules respectively having at least one secondary battery and connected to each other in parallel, the switch diagnosing apparatus comprising: a plurality of positive electrode module switches, each positive electrode module switch included in a respective positive electrode charging and discharging path directly connected to a positive electrode terminal of a corresponding one of the plurality of battery modules to open or close the positive electrode charging and discharging path; a plurality of negative electrode module switches, each negative electrode module switch included in a respective negative electrode charging and discharging path directly connected to a negative electrode terminal of the plurality of battery modules to open or close the negative electrode charging and discharging path; a plurality of positive electrode diagnosis terminals, each positive electrode diagnosis terminal included in a respective positive electrode charging and discharging path between a corresponding positive electrode module switch and a common positive electrode terminal of a battery pack; a plurality of negative electrode diagnosis terminals, each negative electrode diagnosis terminal included in a respective negative electrode charging and discharging path between a corresponding negative electrode module switch and a common negative electrode terminal of the battery pack; a voltage measuring unit configured to measure voltages of each of the plurality of positive electrode diagnosis terminals and each of the plurality of negative electrode diagnosis terminals; and a processor configured to receive the voltages of each of the plurality of positive electrode diagnosis terminals and each of the plurality of negative electrode diagnosis terminals from the voltage measuring unit and diagnose whether the positive electrode module switch and the negative electrode module switch of at least one battery module among the plurality of battery modules are in a stalled state based on the voltage of at least one positive electrode diagnosis terminal and the voltage of at least one negative electrode diagnosis terminal.

In addition, the processor may be configured to select a diagnosis target battery module among the plurality of battery modules and diagnose whether the positive electrode module switch and the negative electrode module switch of the diagnosis target battery module are in a stalled state based on the voltages of the positive electrode diagnosis terminal and the negative electrode diagnosis terminal connected to a battery module other than the diagnosis target battery module.

In addition, the processor may be configured to determine that the positive electrode module switch and the negative electrode module switch of the diagnosis target battery module are in the stalled state when a voltage difference of the positive electrode diagnosis terminal and the negative electrode diagnosis terminal connected to the battery module other than the diagnosis target battery module is equal to or greater than a predetermined threshold value.

In addition, the processor may be configured to determine that the positive electrode module switch and the negative electrode module switch of the diagnosis target battery module are in a normal state when a voltage difference of the positive electrode diagnosis terminal and the negative electrode diagnosis terminal connected to the battery module other than the diagnosis target battery module is equal to or smaller than a predetermined threshold value.

In addition, a battery management system (BMS) according to an embodiment of the present disclosure comprises the switch diagnosing apparatus of any of the embodiments of the present disclosure.

In addition, a battery pack according to an embodiment of the present disclosure comprises the switch diagnosing apparatus of any of the embodiments of the present disclosure.

In one aspect of the present disclosure, there is provided a switch diagnosing method, which diagnoses switches of a plurality of battery modules respectively having at least one secondary battery and connected to each other in parallel, the switch diagnosing method comprising: measuring, by a voltage measuring unit, (i) a voltage of a positive electrode diagnosis terminal included in an integrated positive electrode path between a positive electrode terminal of a battery pack and a plurality of positive electrode module switches, each positive electrode module switch included in a respective positive electrode charging and discharging path directly connected to a positive electrode terminal of a respective battery module of the plurality of battery modules, each positive electrode module switch configured to open or close the respective positive electrode charging and discharging path, and (ii) a voltage of a negative electrode diagnosis terminal included in an integrated negative electrode path between a negative electrode terminal of the battery pack and a plurality of negative electrode module switches, each negative electrode module switch included in a respective negative electrode charging and discharging path directly connected to a negative electrode terminal of the respective battery module, each negative electrode module switch configured to open or close the respective negative electrode charging and discharging path; and diagnosing whether the positive electrode module switch and the negative electrode module switch of at least one battery module among the plurality of battery modules are in a stalled state based on the voltages of the positive electrode diagnosis terminal and the negative electrode diagnosis terminal measured in the voltage measuring step.

Advantageous Effects

According to an aspect of the present disclosure, if a plurality of battery modules having a parallel structure are provided, the switch provided to a diagnosis target battery module may be effectively diagnosed based on the voltage of a switch provided to a battery module other than the diagnosis target battery module. By this, the switch diagnosing apparatus and method according to an embodiment of the present invention may improve stability by performing additional diagnosis in addition to the diagnosis of the diagnosis target battery module itself.

The present disclosure may have various effects other than the above, and other effects of the present disclosure may be understood from the following description and more clearly figured out by the embodiments of the present disclosure.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Further, in describing the present disclosure, if it is determined that a detailed description of a related known structure or function may obscure the subject matter of the present disclosure, the detailed description will be omitted.

Throughout the specification, when a portion is referred to as "comprising" or "including" any element, it means that the portion may include other elements further, without excluding other elements, unless specifically stated otherwise. Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

In the specification, a secondary battery means one independent cell that has a cathode terminal and a cathode terminal and is physically separable. For example, one pouch-type lithium polymer cell may be considered as a secondary battery.

A switch diagnosing apparatus according to an embodiment of the present disclosure may be an apparatus for diagnosing switches provided to a plurality of battery modules respectively having at least one secondary battery and connected with each other in parallel. For example, the plurality of battery modules may be provided in a battery pack and electrically connected to each other in parallel. In addition, as shown in FIG. 1, both ends of the battery pack may be electrically connected to a vehicle load 50.

Figure 1:
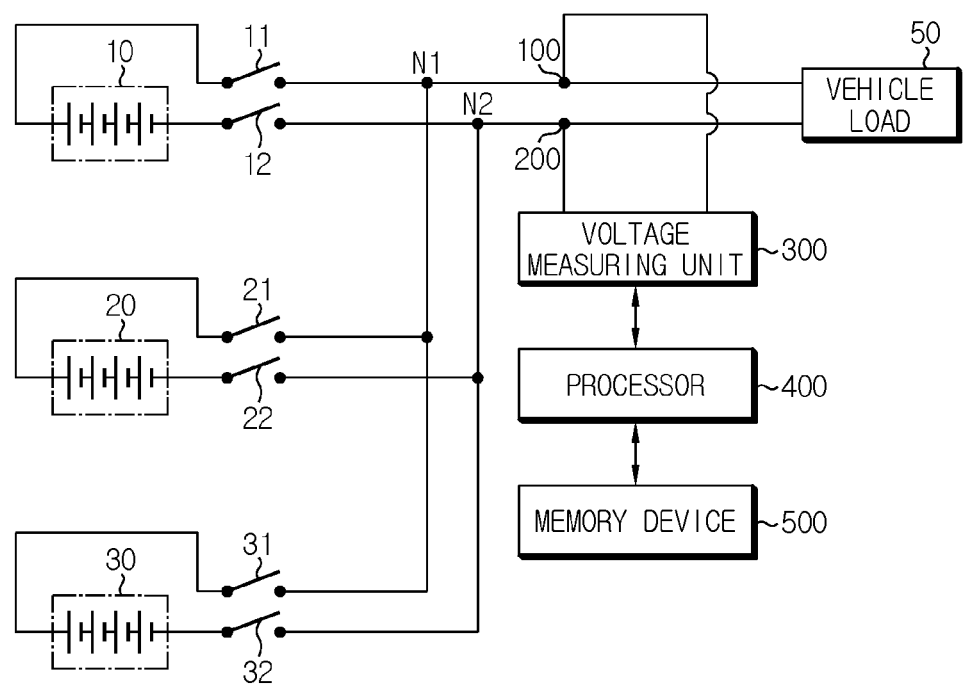
FIG. 1 is a diagram schematically showing that a switch diagnosing apparatus according to an embodiment of the present disclosure connected to some components of a battery pack.

FIG. 1 is a diagram schematically showing that a switch diagnosing apparatus according to an embodiment of the present disclosure connected to some components of a battery pack.

Referring to FIG. 1, the switch diagnosing apparatus according to an embodiment of the present disclosure may include a plurality of positive electrode module switches 11, 21, 31, a plurality of negative electrode module switches 12, 22, 32, a positive electrode diagnosis terminal 100, a negative electrode diagnosis terminal 200, a voltage measuring unit 300 and a processor 400.

The plurality of positive electrode module switches 11, 21, 31 may be provided to a positive electrode charging and discharging path directly connected to the positive electrode terminals of the plurality of battery modules 10, 20, 30, respectively. For example, as shown in FIG. 1, the plurality of positive electrode module switches 11, 21, 31 may be respectively provided on the positive electrode charging and discharging path that directly connect each positive electrode terminal of the plurality of battery modules 10, 20, 30 and a first node N1 to each other. In addition, the plurality of positive electrode module switches 11, 21, 31 may open or close the positive electrode charging and discharging path. For example, as shown in FIG. 1, the plurality of positive electrode module switches 11, 21, 31 may open and close an electric path of the positive electrode charging and discharging path. For example, the plurality of positive electrode module switches 11, 21, 31 may be electrically connected to the processor 400 to transmit and receive electric signals. For example, the plurality of positive electrode module switches 11, 21, 31 may be field effect transistors (FET) having gate, drain, and source terminals. Here, the FET may be turned on or off by forming a channel according to the voltage applied between the gate terminal and the source terminal or not. For example, the FET may be a metal oxide semiconductor field effect transistor (MOSFET).

The plurality of negative electrode module switches 12, 22, 32 may be provided to a negative electrode charging and discharging path directly connected to the negative electrode terminals of the plurality of battery modules 10, 20, 30, respectively. For example, as shown in FIG. 1, the plurality of negative electrode module switches 12, 22, 32 may be provided on the negative electrode charging and discharging path that directly connects the negative electrode terminals of the plurality of battery modules 10, 20, 30 and a second node N2, respectively. In addition, the plurality of negative electrode module switches 12, 22, 32 may open and close the negative electrode charging and discharging path. For example, as shown in FIG. 1, the plurality of negative electrode module switches 12, 22, 32 may open or close an electric path of the negative electrode charging and discharging path. For example, the plurality of negative electrode module switches 12, 22, 32 may be electrically connected to the processor 400 to transmit and receive electric signals. For example, the plurality of negative electrode module switches 12, 22, 32 may be field effect transistors (FET) having gate, drain, and source terminals. Here, the FET may be turned on or off by forming a channel according to the voltage applied between the gate terminal and the source terminal or not. For example, the FET may be a metal oxide semiconductor field effect transistor (MOSFET).

The positive electrode diagnosis terminal 100 may be provided to an integrated positive electrode path between the plurality of positive electrode module switches 11, 21, 31 and a positive electrode terminal of a battery pack. For example, as shown in FIG. 1, the positive electrode diagnosis terminal 100 may be provided to a path that connects the plurality of positive electrode module switches 11, 21, 31 and the positive electrode terminal of the battery pack. More specifically, as shown in FIG. 1, the path connecting the plurality of positive electrode module switches 11, 21, 31 and the first node N1 may be the positive electrode charging and discharging path, and the path connecting the first node N1 and the positive electrode terminal of the battery pack may be the integrated positive electrode path. Here, the positive electrode charging and discharging path and the integrated positive electrode path may be connected at the first node N1.

The negative electrode diagnosis terminal 200 may be provided to an integrated negative electrode path between the plurality of negative electrode module switches 12, 22, 32 and a negative electrode terminal of the battery pack. For example, as shown in FIG. 1, the negative electrode diagnosis terminal 200 may be provided to a path that connects the plurality of negative electrode module switches 12, 22, 32 and the negative electrode terminal of the battery pack. More specifically, as shown in FIG. 1, the path connecting the plurality of negative electrode module switches 12, 22, 32 and the second node N2 may be the negative electrode charging and discharging path, and the path connecting the second node N2 and the negative electrode terminal of the battery pack may be the integrated negative electrode path. Here, the negative electrode charging and discharging path and the integrated negative electrode path may be connected at the second node N2.

The voltage measuring unit 300 may measure voltages of the positive electrode diagnosis terminal 100 and the negative electrode diagnosis terminal 200. For example, as shown in FIG. 1, the voltage measuring unit 300 may be electrically connected to the positive electrode diagnosis terminal 100 and the negative electrode diagnosis terminal 200 to transmit and receive electric signals, respectively.

In addition, the voltage measuring unit 300 may be configured to measure the voltages of the positive electrode diagnosis terminal 100 and the negative electrode diagnosis terminal 200. More specifically, the voltage measuring unit 300 may measure the voltages of the positive electrode diagnosis terminal 100 and the negative electrode diagnosis terminal 200 based on the electric signals received from the positive electrode diagnosis terminal 100 and the negative electrode diagnosis terminal 200.

Preferably, the voltage measuring unit 300 may be electrically connected to the processor 400 to transmit and receive electric signals. In addition, the voltage measuring unit 300 may measure the voltages of the positive electrode diagnosis terminal 100 and the negative electrode diagnosis terminal 200 at time intervals under the control of the processor 400 and output a signal indicating the magnitude of the measured voltage to the processor 400. For example, the voltage measuring unit 300 may be implemented using a voltage measuring circuit generally used in the art.

The processor 400 may receive the voltages of the positive electrode diagnosis terminal 100 and the negative electrode diagnosis terminal 200 from the voltage measuring unit 300 and diagnose whether the positive electrode module switch and the negative electrode module switch of at least one battery module among the plurality of battery modules 10, 20, 30 are in a stalled state, based on the voltages of the positive electrode diagnosis terminal 100 and the negative electrode diagnosis terminal 200. For example, if the first positive electrode module switch 11 and the first negative electrode module switch 12 are in the stalled state, the processor 400 may diagnose that the first positive electrode module switch 11 and the first negative electrode module switch 12 of the first battery module 10 are in the stalled state, based on the voltages of the positive electrode diagnosis terminal 100 and the negative electrode diagnosis terminal 200.

Preferably, if a voltage difference between the positive electrode diagnosis terminal 100 and the negative electrode diagnosis terminal 200 is equal to or greater than a predetermined threshold value, the processor 400 according to an embodiment of the present disclosure may diagnose that the positive electrode module switch and the negative electrode module switch of at least one battery module among the plurality of battery modules 10, 20, 30 are in the stalled state. For example, if the voltage difference between the positive electrode diagnosis terminal 100 and the negative electrode diagnosis terminal 200 corresponds to voltage values at both ends of the battery module, the processor 400 may diagnose that the positive electrode module switch and the negative electrode module switch of at least one battery module among the plurality of battery modules 10, 20, 30 are in the stalled state.

Preferably, if a voltage difference between the positive electrode diagnosis terminal 100 and the negative electrode diagnosis terminal 200 is equal to or smaller than the predetermined threshold value, the processor 400 according to an embodiment of the present disclosure may diagnose that the positive electrode module switches 11, 21, 31 and the negative electrode module switches 12, 22, 32 of the plurality of battery modules 10, 20, 30 are in a normal state, respectively. For example, if the voltage difference between the positive electrode diagnosis terminal 100 and the negative electrode diagnosis terminal 200 corresponds to 0V, the processor 400 may diagnose that the positive electrode module switch and the negative electrode module switch of at least one battery module among the plurality of battery modules 10, 20, 30 are in the normal state. In addition, if the voltage difference between the positive electrode diagnosis terminal 100 and the negative electrode diagnosis terminal 200 is equal to or smaller than the voltage values at both ends of the battery module, the processor 400 may diagnose that the positive electrode module switch and the negative electrode module switch of at least one battery module among the plurality of battery modules 10, 20, 30 are in the normal state.

Preferably, as shown in FIG. 1, the switch diagnosing apparatus according to an embodiment of the present disclosure may further include a memory device 500.

The memory device 500 may store information necessary for the operation of the switch diagnosing apparatus according to an embodiment of the present disclosure in advance. In addition, the memory device 500 may store a threshold voltage value corresponding to the predetermined threshold value between the positive electrode diagnosis terminal 100 and the negative electrode diagnosis terminal 200 in advance. In addition, the memory device 500 may store the voltage values at both ends of the battery module in advance.

Meanwhile, the processor 400 may be implemented to include a processor 400, an application-specific integrated circuit (ASIC), another chipset, a logic circuit, a register, a communication modem, and/or a data processing device known in the art, selectively.

Meanwhile, the memory device 500 is not particularly limited as long as it is a storage medium capable of recording and erasing information. For example, the memory device 500 may be a RAM, a ROM, a register, a hard disk, an optical recording medium, or a magnetic recording medium. The memory device 500 may also be electrically connected to the processor 400 via, for example, a data bus so as to be accessible by the processor 400. The memory device 500 may also store and/or update and/or erase and/or transmit a program including various control logics executed by the processor 400 and/or data generated by executing the control logics.

Figure 2:
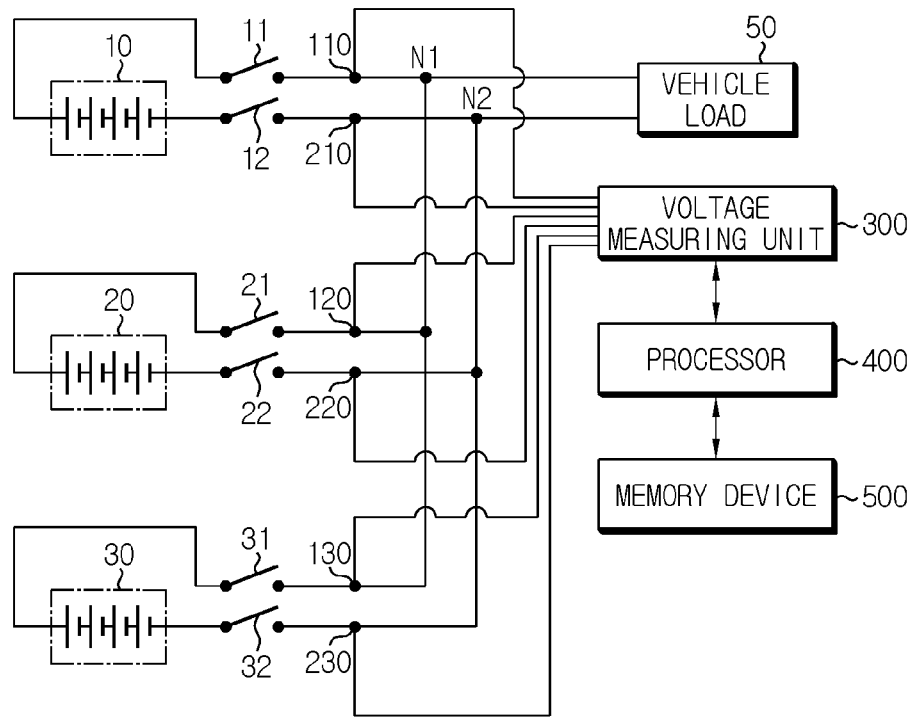
FIG. 2 is a diagram schematically showing that a switch diagnosing apparatus according to another embodiment of the present disclosure connected to some components of the battery pack.

FIG. 2 is a diagram schematically showing that a switch diagnosing apparatus according to another embodiment of the present disclosure connected to some components of the battery pack. Also, regarding this embodiment, features that may be applied similar to the former embodiment will not be described in detail, and features different from the former embodiment will be described in detail.

Referring to FIG. 2, the switch diagnosing apparatus according to an embodiment of the present disclosure may include a plurality of positive electrode module switches 11, 21, 31, a plurality of negative electrode module switches 12, 22, 32, a plurality of positive electrode diagnosis terminals 110, 120, 130, a plurality of negative electrode diagnosis terminals 210, 220, 230, a voltage measuring unit 300 and a processor 400.

The plurality of positive electrode diagnosis terminals 110, 120, 130 may be provided to a positive electrode charging and discharging path between the positive electrode module switch and the positive electrode terminal of the battery pack, respectively. For example, as shown in FIG. 2, the plurality of positive electrode diagnosis terminals 110, 120, 130 may be provided on the positive electrode charging and discharging path between the positive electrode module switches and the first node N1, respectively.

The plurality of negative electrode diagnosis terminals 210, 220, 230 may be provided to a negative electrode charging and discharging path between the negative electrode module switches and the negative electrode terminal of the battery pack, respectively. For example, as shown in FIG. 2, the plurality of negative electrode diagnosis terminals 210, 220, 230 may be provided on the negative electrode charging and discharging path between the negative electrode module switches and the second node N2, respectively.

The voltage measuring unit 300 may measure voltages of the plurality of positive electrode diagnosis terminals 110, 120, 130 and the plurality of negative electrode diagnosis terminals 210, 220, 230. For example, as shown in FIG. 2, the voltage measuring unit 300 may be electrically connected to the plurality of positive electrode diagnosis terminals 110, 120, 130 and the plurality of negative electrode diagnosis terminals 210, 220, 230, respectively, to transmit and receive electric signals.

In addition, the voltage measuring unit 300 may be configured to measure voltages of the plurality of positive electrode diagnosis terminals 110, 120, 130 and the plurality of negative electrode diagnosis terminals 210, 220, 230. More specifically, the voltage measuring unit 300 may measure the voltages of the plurality of positive electrode diagnosis terminals 110, 120, 130 and the plurality of negative electrode diagnosis terminals 210, 220, 230, based on electric signals received from the plurality of positive electrode diagnosis terminals 110, 120, 130 and the plurality of negative electrode diagnosis terminals 210, 220, 230.

Preferably, the voltage measuring unit 300 may be electrically connected to the processor 400 to transmit and receive electric signals. In addition, the voltage measuring unit 300 measures the voltages of the plurality of positive electrode diagnosis terminals 110, 120, 130 and the plurality of negative electrode diagnosis terminals 210, 220, 230 at time intervals under the control of the processor 400 and output a signal indicating the magnitude of the measured voltage to the processor 400. For example, the voltage measuring unit 300 may be implemented using a voltage measuring circuit generally used in the art.

The processor 400 may receive the voltages of the plurality of positive electrode diagnosis terminals 110, 120, 130 and the plurality of negative electrode diagnosis terminals 210, 220, 230 from the voltage measuring unit 300 and diagnose whether the positive electrode module switch and the negative electrode module switch of at least one battery module among the plurality of battery modules 10, 20, 30 are in the stalled state, based on the voltage of at least one positive electrode diagnosis terminal and the voltage of at least one negative electrode diagnosis terminal. For example, in order to diagnose whether the first positive electrode module switch 11 and the first negative electrode module switch 12 of the first battery module 10 are in a stalled state, the processor 400 may diagnose whether the first positive electrode module switch 11 and the first negative electrode module switch 12 of the first battery module 10 are in a stalled state based on a voltage difference between the second positive electrode diagnosis terminal 120 and the second negative electrode diagnosis terminal 220. Alternatively, in order to diagnose whether the first positive electrode module switch 11 and the first negative electrode module switch 12 of the first battery module 10 are in a stalled state, the processor 400 may determine whether the first positive electrode module switch 11 and the first negative electrode module switch 12 of the first battery module 10 are in a stalled state based on a voltage difference between the third positive electrode diagnosis terminal 130 and the third negative electrode diagnosis terminal 230.

Preferably, the processor 400 according to an embodiment of the present disclosure may select a diagnosis target battery module among the plurality of battery modules 10, 20, 30 and diagnose whether the positive electrode module switch and the negative electrode module switch of the diagnosis target battery module are in a stalled state, based on the voltages of the positive electrode diagnosis terminal and the negative electrode diagnosis terminal provided to a battery module other than the diagnosis target battery module. For example, the processor 400 may select the diagnosis target battery module among the plurality of battery modules 10, 20, 30. For example, the processor 400 may select one battery module among the plurality of battery modules 10, 20, 30 as the diagnosis target battery module in order. For example, the processor 400 may select the first battery module 10 as the diagnosis target battery module. In addition, the processor 400 may diagnose whether the first positive electrode module switch 11 and the first negative electrode module switch 12 of the first battery module 10 are in a stalled state, based on the voltages of the second and third positive electrode diagnosis terminals 120, 130 and the second and third negative electrode diagnosis terminals 220, 230 provided to the second battery module 20 and the third battery module 30 other than the first battery module 10.

Preferably, if a voltage difference between the positive electrode diagnosis terminal and the negative electrode diagnosis terminal provided to a battery module other than the diagnosis target battery module is equal to or greater than the predetermined threshold value, the processor 400 according to an embodiment of the present disclosure may diagnose that the positive electrode module switch and the negative electrode module switch of the diagnosis target battery module are in the stalled state. For example, when the processor 400 selects the first battery module 10 as the diagnosis target battery module, it may diagnosed that the first positive electrode module switch 11 and the first negative electrode module switch 12 of the first battery module 10 are in the stalled state if a voltage difference between the second positive electrode diagnosis terminal 120 and the second negative electrode diagnosis terminal 220 provided to the second battery module 20 is equal to or greater than the predetermined threshold value. In addition, when the first battery module 10 is selected as the diagnosis target battery module, the processor 400 may diagnose that the first positive electrode module switch 11 and the first negative electrode module switch 12 of the battery module 10 are in the stalled state if a voltage difference between the third positive electrode diagnosis terminal 130 and the third negative electrode diagnosis terminal 230 provided to the third battery module 30 is equal to or greater than the predetermined threshold value. Here, the predetermined threshold value may be the voltage values at both ends of the battery module.

Preferably, if a voltage difference between the positive electrode diagnosis terminal and the negative electrode diagnosis terminal provided to a battery module other than the diagnosis target battery module is equal to or smaller than the predetermined threshold value, the processor 400 according to an embodiment of the present disclosure may diagnose that the positive electrode module switch and the negative electrode module switch of the diagnosis target battery module are in a normal state. For example, when the processor 400 selects the first battery module 10 as the diagnosis target battery module, it may be diagnosed that the first positive electrode module switch 11 and the first negative electrode module switch 12 of the first battery module 10 are in a normal state if the voltage difference between the second positive electrode diagnosis terminal 120 and the second negative electrode diagnosis terminal 220 provided to the second battery module 20 is equal to or smaller than the predetermined threshold value. In addition, when the first battery module 10 is selected as the diagnosis target battery module, the processor 400 may diagnose that the first positive electrode module switch 11 and the first negative electrode module switch 12 of the battery module 10 are in the normal state if the voltage difference between the third positive electrode diagnosis terminal 130 and the third negative electrode diagnosis terminal 230 provided to the third battery module 30 is equal to or smaller than the predetermined threshold value. Here, the predetermined threshold value may be 0V.

The switch diagnosing apparatus according to the present disclosure may be applied to a battery management system (BMS). That is, the BMS according to the present disclosure may include the switch diagnosing apparatus of the present disclosure as described above. In this configuration, at least a part of the components of the switch diagnostic apparatus according to the present disclosure may be implemented by supplementing or adding functionality of components included in the conventional BMS. For example, the processor 400 and the memory device 500 of the switch diagnosing apparatus according to the present disclosure may be implemented as components of the BMS.

In addition, the switch diagnosis apparatus according to the present disclosure may be provided to a battery pack. That is, the battery pack according to the present disclosure may include the switch diagnosing apparatus of the present disclosure as described above. Here, the battery pack may include at least one secondary battery, the switch diagnosing apparatus, electrical components (including a BMS, a relay, a fuse, and the like), and a case.

Figure 3:
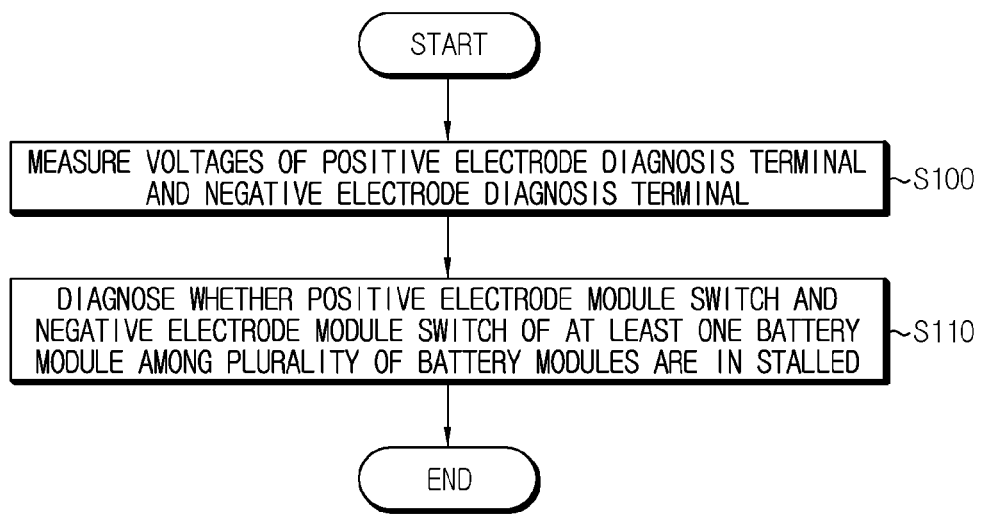
FIG. 3 is a flowchart schematically showing a switch diagnosing method according to an embodiment of the present disclosure.

FIG. 3 is a flowchart schematically showing a switch diagnosing method according to an embodiment of the present disclosure. In FIG. 3, a subject of each step may be each component of the switch diagnosis apparatus for electric components according to the present disclosure, explained above.

As shown in FIG. 3, the switch diagnosing method according to the present disclosure includes a voltage measuring step (S100) and a diagnosing step (S110).

First, in the voltage measuring step (S100), it is possible to measure a voltage of a positive electrode diagnosis terminal provided to an integrated positive electrode path between a plurality of positive electrode module switches respectively provided to a positive electrode charging and discharging path directly connected to positive electrode terminals of the plurality of battery modules to open or close the positive electrode charging and discharging path and a positive electrode terminal of a battery pack, and a voltage of a negative electrode diagnosis terminal provided to an integrated negative electrode path between a plurality of negative electrode module switches respectively provided to a negative electrode charging and discharging path directly connected to negative electrode terminals of the plurality of battery modules to open or close the negative electrode charging and discharging path and a negative electrode terminal of the battery pack. Then, in the diagnosing step (S110), it is possible to diagnose whether the positive electrode module switch and the negative electrode module switch of at least one battery module among the plurality of battery modules are in a stalled state based on the voltages of the positive electrode diagnosis terminal and the negative electrode diagnosis terminal measured in the voltage measuring step.

Preferably, in the diagnosing step (S110) according to an embodiment of the present disclosure, it may be diagnosed that the positive electrode module switch and the negative electrode module switch of at least one battery module among the plurality of battery modules is in the stalled state when a voltage difference between the positive electrode diagnosis terminal and the negative electrode diagnosis terminal are equal to or greater than a predetermined threshold value.

Preferably, in the diagnosing step (S110) according to an embodiment of the present disclosure, it may be diagnosed that the positive electrode module switches and the negative electrode module switches of the plurality of battery modules are in a normal state when a voltage difference between the positive electrode diagnosis terminal and the negative electrode diagnosis terminal are equal to or smaller than a predetermined threshold value.

Also, when the control logic is implemented in software, the processor may be implemented as a set of program modules. At this time, the program modules may be stored in a memory device and executed by a processor.

In addition, there is no particular limitation on the types of various control logics of the processor, as long as one or more control logics are combined and the combined control logic is written in a computer-readable code system so that the computer-readable access is possible. As one example, the recording medium includes at least one selected from the group consisting of a ROM, a RAM, a register, a CD-ROM, a magnetic tape, a hard disk, a floppy disk and an optical data recording device. In addition, the code system may be stored and executed in a distributed manner on computers connected through a network. Moreover, functional programs, code and segments for implementing the combined control logics may be easily inferred by programmers in the technical field to which the present disclosure belongs.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

10: first battery module
20: second battery module
30: third battery module
11: first positive electrode module switch
12: first negative electrode module switch
21: second positive electrode module switch
22: second negative electrode module switch
31: third positive electrode module switch
32: third negative electrode module switch
100: positive electrode diagnosis terminal
110: first positive electrode diagnosis terminal
120: second positive electrode diagnosis terminal
130: third positive electrode diagnosis terminal
200: negative electrode diagnosis terminal
210: first negative electrode diagnosis terminal
220: second negative electrode diagnosis terminal
230: third negative electrode diagnosis terminal
300: voltage measuring unit
400: processor
500: memory device
N1: first node
N2: second node

What is claimed is:

1. A switch diagnosing apparatus, which diagnoses switches of a plurality of battery modules respectively having at least one secondary battery and connected to each other in parallel, the switch diagnosing apparatus comprising:
a plurality of non-overlapping positive electrode charging and discharging paths, each positive electrode charging and discharging path connecting a positive electrode terminal of a respective one of the plurality of battery modules to a common positive electrode terminal of the battery pack;
a plurality of non-overlapping negative electrode charging and discharging paths, each negative electrode charging and discharging path connecting a negative electrode terminal of a respective one of the plurality of battery modules to a common negative electrode terminal of the battery pack;
a plurality of positive electrode module switches, each positive electrode module switch included in a respective positive electrode charging and discharging path to open or close the respective positive electrode charging and discharging path;
a plurality of negative electrode module switches, each negative electrode module switch included in a respective negative electrode charging and discharging path to open or close the respective negative electrode charging and discharging path;
a voltage measuring unit;
a plurality of non-overlapping positive electrode diagnosis paths, each positive electrode diagnosis path connecting the voltage measuring unit to a respective positive electrode diagnosis terminal included in a respective positive electrode charging and discharging path between a corresponding positive electrode module switch and the common positive electrode terminal of the battery pack;
a plurality of non-overlapping negative electrode diagnosis paths, each negative electrode diagnosis path connecting the voltage measuring unit to a respective negative electrode diagnosis terminal included in a respective negative electrode charging and discharging path between a corresponding negative electrode module switch and the common negative electrode terminal of the battery pack;
wherein the voltage measuring unit is configured to measure voltages of each of the plurality of positive electrode diagnosis terminals and each of the plurality of negative electrode diagnosis terminals; and
a processor configured to receive the voltages of each of the plurality of positive electrode diagnosis terminals and each of the plurality of negative electrode diagnosis terminals from the voltage measuring unit and diagnose whether the positive electrode module switch and the negative electrode module switch of at least one battery module among the plurality of battery modules are in a stalled state based on the voltage of at least one positive electrode diagnosis terminal and the voltage of at least one negative electrode diagnosis terminal.

2. The switch diagnosing apparatus according to claim 1, wherein the processor is configured to select a diagnosis target battery module among the plurality of battery modules and diagnose whether the positive electrode module switch and the negative electrode module switch of the diagnosis target battery module are in a stalled state based on the voltages of the positive electrode diagnosis terminal and the negative electrode diagnosis terminal included in the respective positive and negative electrode charging and discharging paths corresponding to a battery module other than the diagnosis target battery module.

3. The switch diagnosing apparatus according to claim 2, wherein the processor is configured to determine that the positive electrode module switch and the negative electrode module switch of the diagnosis target battery module are in the stalled state when a voltage difference between the positive electrode diagnosis terminal and the negative electrode diagnosis terminal connected to the battery module other than the diagnosis target battery module is equal to or greater than a predetermined threshold value.

4. The switch diagnosing apparatus according to claim 2, wherein the processor is configured to determine that the positive electrode module switch and the negative electrode module switch of the diagnosis target battery module are in a normal state when a voltage difference between the positive electrode diagnosis terminal and the negative electrode diagnosis terminal connected to the battery module other than the diagnosis target battery module is equal to or smaller than a predetermined threshold value.

5. A battery management system (BMS), comprising the switch diagnosing apparatus according to claim 1.

6. A battery pack, comprising the switch diagnosing apparatus according to claim 1.

7. A switch diagnosing method, which diagnoses switches of a plurality of battery modules respectively having at least one secondary battery and connected to each other in parallel, the switch diagnosing method comprising:
measuring, by a voltage measuring unit, (i) a voltage of at least one positive electrode diagnosis terminal among a plurality of positive electrode diagnosis terminals, each positive electrode diagnosis terminal included in a respective integrated positive electrode path between a corresponding positive electrode module switch and a common positive electrode terminal of the battery pack, and connected to the voltage measuring unit by a respective positive electrode diagnosis path of a plurality of non-overlapping positive electrode diagnosis paths, each positive electrode module switch connecting a positive electrode terminal of a respective one of the plurality of battery modules to the common positive electrode terminal of the battery pack and configured to open or close the respective integrated positive electrode path, and (ii) a voltage of at least one negative electrode diagnosis terminal among a plurality of negative electrode diagnosis terminals, each negative electrode diagnosis terminal included in a respective integrated negative electrode path between a corresponding negative electrode module switch and a common negative electrode terminal of the battery pack and connected to the voltage measuring unit by a respective negative electrode diagnosis path of a plurality of non-overlapping negative electrode diagnosis paths, each negative electrode module switch connecting a negative electrode terminal of the respective battery module to the common negative electrode terminal of the battery pack and configured to open or close the respective integrated negative electrode path; and diagnosing, by a processor, whether the positive electrode module switch and the negative electrode module switch of at least one battery module among the plurality of battery modules are in a stalled state based on the voltages of the at least one positive electrode diagnosis terminal and the at least one negative electrode diagnosis terminal measured in the voltage measuring step.

* * * * *